(12) United States Patent
Liao et al.

(10) Patent No.: US 12,484,149 B2
(45) Date of Patent: Nov. 25, 2025

(54) ELECTRIC DEVICE, ITS CIRCUIT BOARD AND METHOD OF MANUFACTURING THE ELECTRIC DEVICE

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Chih-Chieh Liao, Hsinchu (TW); Yu-Min Sun, Hsinchu (TW); Chih-Feng Cheng, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 628 days.

(21) Appl. No.: 17/818,722

(22) Filed: Aug. 10, 2022

(65) Prior Publication Data
US 2023/0422398 A1 Dec. 28, 2023

(30) Foreign Application Priority Data
Jun. 23, 2022 (TW) ............................ TW111123504

(51) Int. Cl.
*H05K 1/11* (2006.01)
*H01L 23/00* (2006.01)
(Continued)

(52) U.S. Cl.
CPC .......... *H05K 1/111* (2013.01); *H01L 23/3128* (2013.01); *H05K 1/181* (2013.01);
(Continued)

(58) Field of Classification Search
None
See application file for complete search history.

(56) References Cited

U.S. PATENT DOCUMENTS 5,569,960 A * 10/1996 Kumazawa .......... H05K 3/3436
257/738
2008/0185735 A1 8/2008 Pham et al.
(Continued)

FOREIGN PATENT DOCUMENTS

CN 101261974 A 9/2008
TW 201133741 A 10/2011
(Continued)

*Primary Examiner* — Jay C Chang
(74) *Attorney, Agent, or Firm* — CKC & Partners Co., LLC

(57) ABSTRACT

An electric device includes a semiconductor assembly, a circuit board, first conductive pads and second conductive pads. The circuit board has a chip-mounted area with a rectangular shape. The first conductive pads are arranged in a center zone or all corner zones of the chip-mounted area, and the second conductive pads are arranged within the rest in the chip-mounted area. The first conductive pads are respectively soldered to one part of solder joints of the semiconductor assembly through first solder-ball portions, and the second conductive pads are respectively soldered to another part of the solder joints of the semiconductor assembly through second solder-ball portions. Each of the second conductive pads is sized smaller than one of the first conductive pads, and a maximum width of each of the second solder-ball portions is greater than a maximum width of each of the first solder-ball portions.

8 Claims, 8 Drawing Sheets

(51) Int. Cl.
*H01L 23/13* (2006.01)
*H01L 23/31* (2006.01)
*H05K 1/18* (2006.01)
*H05K 3/00* (2006.01)
*H05K 3/34* (2006.01)

(52) U.S. Cl.
CPC ......... *H05K 3/0005* (2013.01); *H05K 3/3436* (2013.01); *H01L 23/13* (2013.01); *H01L 24/16* (2013.01); *H01L 2224/16227* (2013.01); *H05K 2201/0939* (2013.01); *H05K 2201/094* (2013.01); *H05K 2201/09418* (2013.01); *H05K 2201/10378* (2013.01); *H05K 2201/10734* (2013.01)

(56) References Cited

U.S. PATENT DOCUMENTS

| 2011/0049711 A1* | 3/2011 | Jayantha | H01L 23/49816 257/738 |
|---|---|---|---|
| 2020/0020603 A1 | 1/2020 | Tsao et al. | |
| 2021/0098327 A1 | 4/2021 | Tsao et al. | |
| 2021/0305184 A1* | 9/2021 | Zhang | H01L 23/49838 |

FOREIGN PATENT DOCUMENTS

| TW | I607536 B | 12/2017 |
|---|---|---|
| TW | 202114104 A | 4/2021 |

\* cited by examiner

ELECTRIC DEVICE, ITS CIRCUIT BOARD AND METHOD OF MANUFACTURING THE ELECTRIC DEVICE

RELATED APPLICATIONS

This application claims priority to Taiwan Application Serial Number 111123504, filed on Jun. 23, 2022, which is herein incorporated by reference.

BACKGROUND

Field of Disclosure

The present disclosure relates to an electric device. More particularly, the present disclosure relates to an electric device with a circuit board having conductive pads of different sizes.

Description of Related Art

Generally, a semiconductor assembly is mounted on a circuit board through a surface mount technology (SMT) of a ball grid array (BGA) package.

However, it is common that heat concentration occurs in corner regions of one of the semiconductor devices in practice, so that heat load therefrom may cause warpage of a substrate of the semiconductor device, thereby causing bridging of adjacent solder balls in the corner regions. Therefore, the connection performance between the semiconductor device and the circuit board is degraded, thereby affecting the reliability of the semiconductor device. It is noted that the above-mentioned technology obviously still has inconvenience and defects, and needs to be further improved.

Therefore, how to develop a solution to improve the foregoing deficiencies and inconvenience is an important issue that relevant persons engaged in the industry are currently unable to delay.

SUMMARY

One aspect of the present disclosure is to provide an electric device, a circuit board of the electric device and a method of manufacturing the electric device to solve the aforementioned problems of the prior art.

In one embodiment of the present disclosure, an electric device is provided, and the electric device includes a semiconductor assembly, a circuit board, a plurality of first conductive pads and a plurality of second conductive pads. The semiconductor assembly includes a substrate, a die and an encapsulated portion. The substrate has a first surface and a second surface which are opposite to each other. The die is fixedly mounted on the second surface of the substrate. The encapsulated portion wraps the die on the substrate, and the first surface of the substrate is formed with a plurality of solder joints. The circuit board has a chip-mounted area with a rectangular shape, and the chip-mounted area includes a center zone and a plurality of corner zones. The first conductive pads are spaced to be arranged in the center zone or all of the corner zones of the chip-mounted area, and the first conductive pads are respectively soldered to one part of the solder joints through a plurality of first solder-ball portions. The second conductive pads are spaced to be arranged within the rest area in the chip-mounted area, and the second conductive pads are respectively soldered to another part of the solder joints through a plurality of second solder-ball portions. Each of the second conductive pads is sized smaller than one of the first conductive pads, and a maximum width of each of the second solder-ball portions is greater than a maximum width of each of the first solder-ball portions.

In one embodiment of the present disclosure, a circuit board is provided, and the circuit board includes a plate body, a plurality of first conductive pads and a plurality of second conductive pads. One surface of the plate body has a chip-mounted area with a rectangular shape, and the chip-mounted area includes a center zone and a plurality of corner zones. The first conductive pads are spaced to be arranged in the center zone or all of the corner zones of the chip-mounted area. The second conductive pads are spaced to be arranged within the rest area in the chip-mounted area. Each of the second conductive pads is sized smaller than one of the first conductive pads.

In one embodiment of the present disclosure, a method of manufacturing an electric device is provided, and the method includes several steps as follows. A semiconductor assembly is provided, and the semiconductor assembly is provided with a substrate, a die fixedly mounted on one surface of the substrate, and a plurality of solder joints formed on the other surface of the substrate. A circuit layout pattern for a circuit board is designed. The circuit board is made according to the circuit layout pattern, and the circuit layout pattern includes a chip-mounted area, a plurality of first conductive pads spaced to be arranged in a center zone or corner zones of the chip-mounted area, and a plurality of second conductive pads spaced to be arranged within the rest area in the chip-mounted area, and each of the second conductive pads is sized smaller than one of the first conductive pads. The first conductive pads are respectively soldered to one part of the solder joints through a plurality of first solder-ball portions, and the second conductive pads are respectively soldered to another part of the solder joints through a plurality of second solder-ball portions, and a maximum width of each of the second solder-ball portions is greater than a maximum width of each of the first solder-ball portions.

Thus, through the construction of the embodiments above, the disclosure can reduce the possibilities of solder bridging on the circuit board, improve the connection performance between the semiconductor device and the circuit board, and thus improve the reliability of the semiconductor device.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
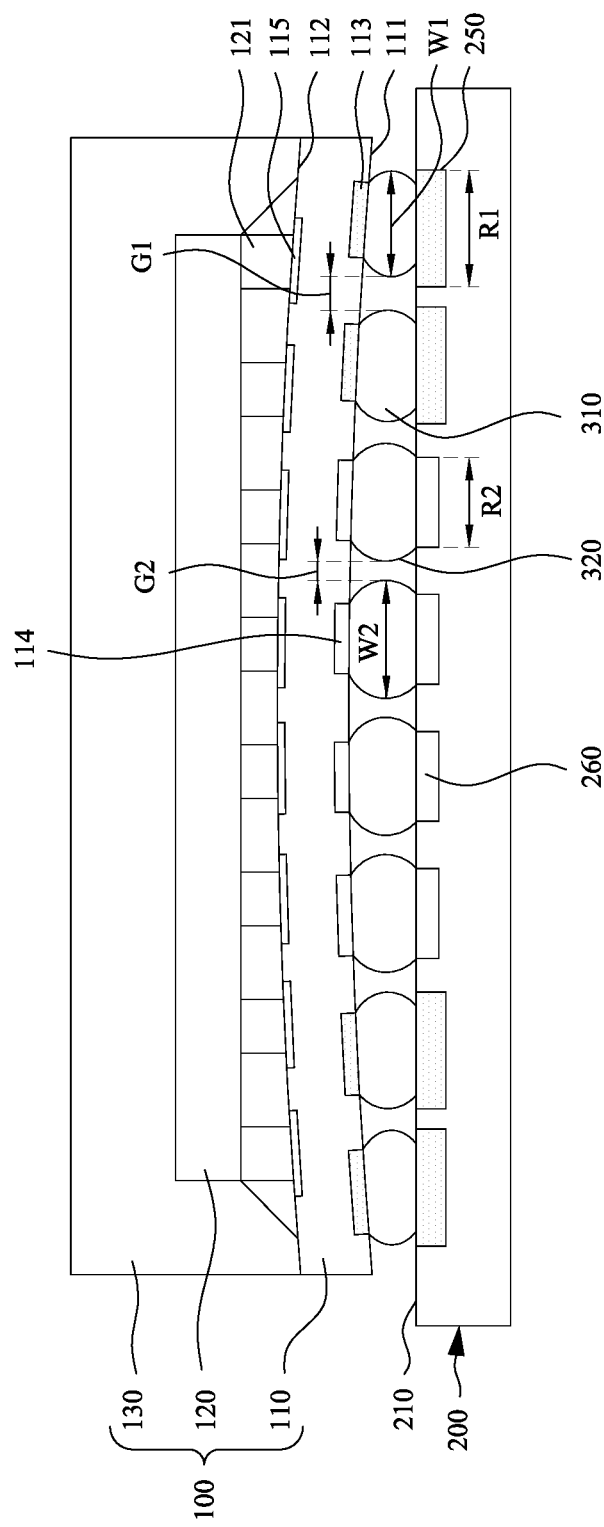
FIG. 1 is a schematic view of an electric device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
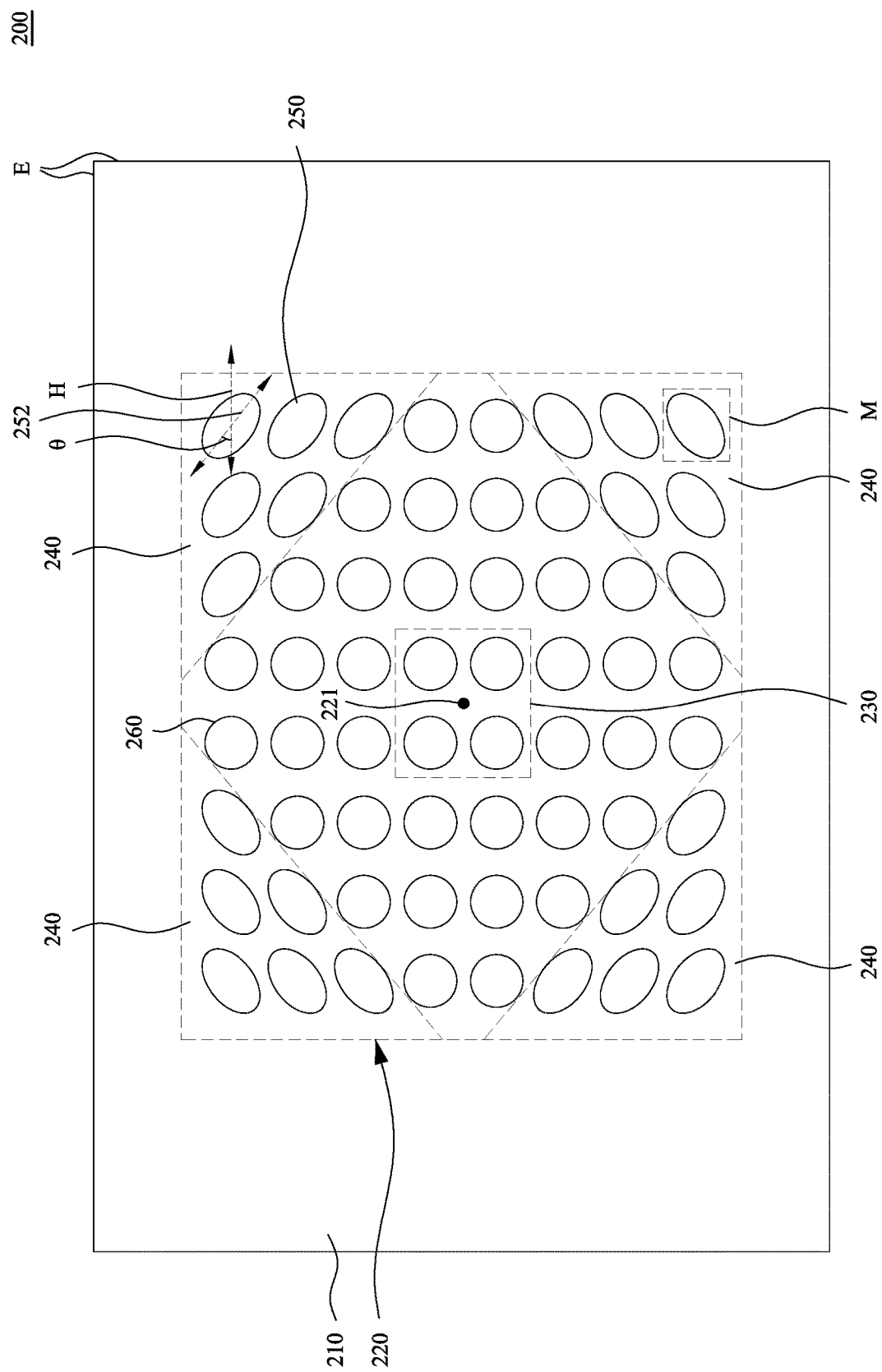
FIG. 2 is a top view of the circuit board of the embodiment.
Figure 3:
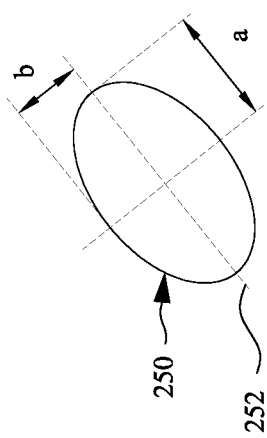
FIG. 3 is a partial enlarged view of an area M in FIG. 2.

Reference is now made to FIG. 1 to FIG. 3, in which FIG. 1 is a schematic view of an electric device 10 according to one embodiment of the present disclosure, FIG. 2 is a top view of the circuit board 200 of the embodiment, and FIG. 3 is a partial enlarged view of an area M in FIG. 2. As shown in FIG. 1 to FIG. 2, in the embodiment, the electric device 10 includes a semiconductor assembly 100, a circuit board 200, a plurality of first conductive pads 250, a plurality of second conductive pads 260, a plurality of first solder-ball portions (e.g., solder ball) 310 and a plurality of second solder-ball portions (e.g., solder ball) 320. The semiconductor assembly 100 is formed with a plurality of solder joints (called first solder joints 113 and second solder joints 114, hereinafter).

The circuit board 200 has a chip-mounted area 220 at one part of the top surface 210 thereof, and the chip-mounted area 220 is with a rectangular shape having a center zone 230 and a plurality of corner zones 240, in other words, the corner zones 240 are spaced around the center zone 230, and the center zone 230 is located at where the diagonal lines of the corner zones 240 intersect. The first conductive pads 250 are spaced to be arranged in all of the corner zones 240 of the chip-mounted area 220, and the second conductive pads 260 are spaced to be arranged within the rest area (including the center zone 230) in the chip-mounted area 220 except the corner zones 240. The outline of each of the first conductive pads 250 is substantially different from that of each of the second conductive pads 260, and an area R1 of each of the first conductive pads 250 is substantially larger than an area R2 of each of the second conductive pads 260. The first conductive pads 250 are respectively soldered to the first solder joints 113 through the first solder-ball portions 310, and the second conductive pads 260 are respectively soldered to the second solder joints 114 through a plurality of second solder-ball portions 320.

More specifically, the semiconductor assembly 100 includes a substrate 110, a die 120 and an encapsulated portion 130. The substrate 110 has a first surface 111 and a second surface 112 which are opposite to each other. The first solder joints 113 and the second solder joints 114 are spaced to be arranged on the first surface 111 of the substrate 110. The substrate 110 is formed with a plurality of solder pads 115 spaced to be arranged on the second surface 112 of the substrate 110. The die 120 is formed with a plurality of conductive bumps 121 arranged on one surface of the die 120 at intervals. The conductive bumps 121 of the die 120 are respectively soldered to the solder pads 115 of the substrate 110 through solder material (not shown), so that the die 120 is fixedly mounted on the second surface 112 of the substrate 110. The encapsulated portion 130 wraps the die 120 on the substrate 110.

In this way, no matter whether the substrate 110 of the semiconductor assembly 100 is in an infant-crying-curve shape due to thermal load, since the area R1 of one of the first conductive pads 250 within the corner zones 240 is greater than the area R2 of one of the second conductive pads 260, on the basis of the same size of solder balls (that is, the volume of each of the first solder-ball portions 310 is approximately equal to the volume of each of the second solder-ball portions 320), the maximum width W1 of the first solder-ball portion 310 (e.g., the maximum circumference of the waist of the first solder-ball portion 310) will be smaller than the maximum width W2 of the second solder-ball portion 320 (e.g., the maximum circumference of the waist of the second solder-ball portion 320). A gap G1 between any two adjacent ones of the first solder-ball portions 310 is greater than a gap G2 between any two adjacent ones od the second solder-ball portions 320, thereby reducing the possibilities that solder bridging occurred between the first solder-ball portions 310 within the corner zones 240.

FIG. 3 is a partial enlarged view of an area M in FIG. 2. Furthermore, as shown in FIG. 2 and FIG. 3, the first conductive pads 250 are elongated. For example, each of the first conductive pads 250 is in an oval shape, and each of the second conductive pads 260 is in a round shape. Each of the first conductive pads 250 has a long axis direction 252, and the long axis direction 252 passes through any two adjacent sides E (i.e., the adjacent sides of the rectangle) of the chip-mounted area 220. A horizontal line H of the chip-mounted area 220 and the long axis direction 252 of each of the first conductive pads 250 respectively form an included angle θ within 45°-60°, so that the problem of the first solder-ball portions 310 welded together can be minimized. However, the disclosure is not limited to types of the first conductive pads 250 and the second conductive pads 260.

For example, in each of the first conductive pads 250, the semi-major axis (a) is 0.23 mm and the semi-minor axis (b) is 0.2 mm, so that the area of each of the first conductive pads 250 is 0.145 mm2 (0.2*0.23*π). The radius of each of the second conductive pads 260 is 0.2 mm, so that the area of the second conductive pad 260 is 0.126 mm 2 (0.22^2*π), which is 15% smaller than the area of each of the first conductive pads 250.

Figure 4:
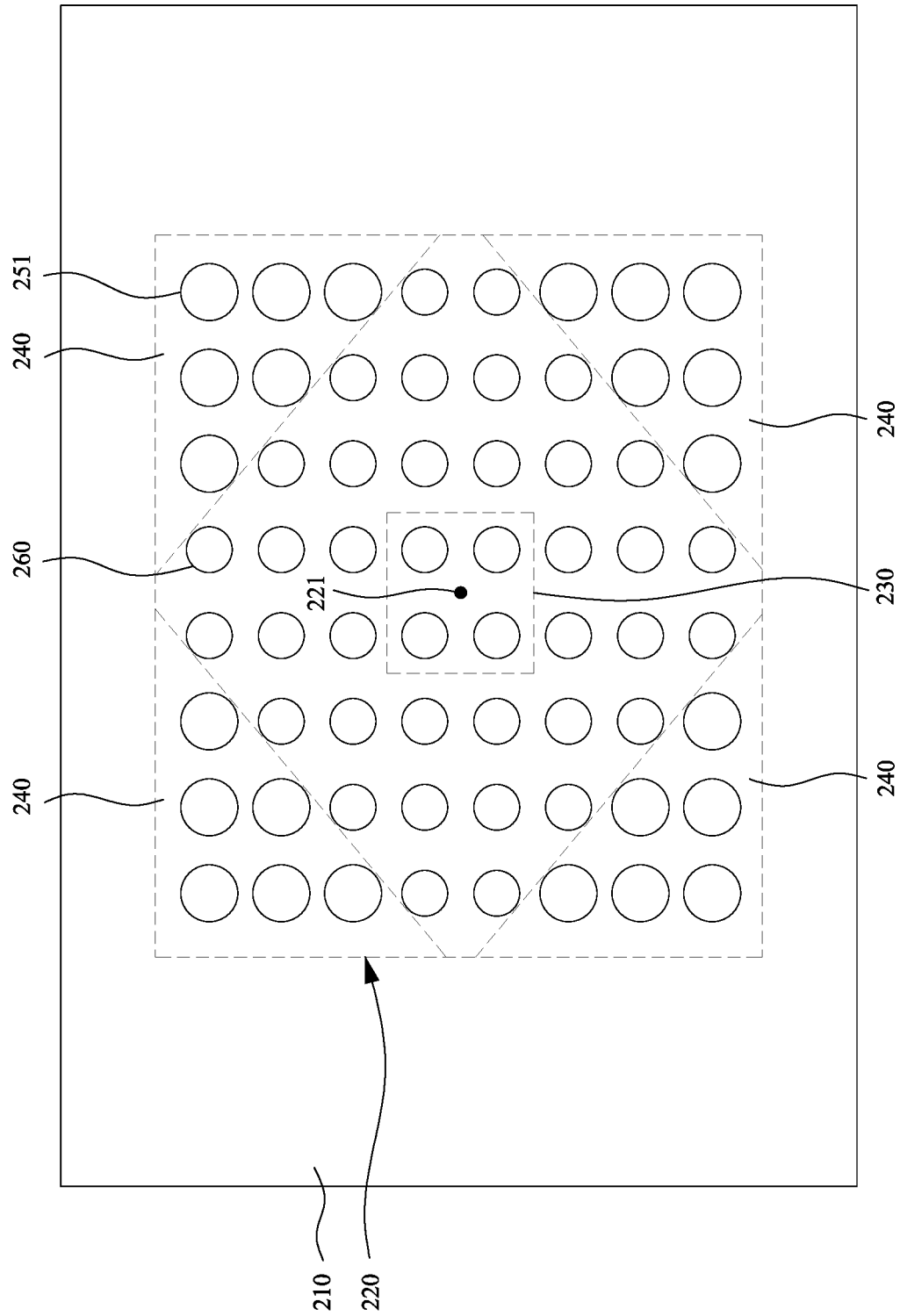
FIG. 4 is a top view of a circuit board according to one embodiment of the present disclosure.

FIG. 4 is a top view of a circuit board 201 according to one embodiment of the present disclosure. As shown in FIG. 4, the circuit board 201 of the embodiment is substantially the same to the circuit board 200 in FIG. 2, except that the shape of each of the first conductive pads 251 and the shape of each of the second conductive pads 260 in this embodiment are the same, but the area R1 of each of the first conductive pads 251 is still larger than the area R2 of each of the second conductive pads 260. For example, the first conductive pads 251 and the second conductive pads 260 are in circular shapes with different areas, respectively.

Therefore, even if the first conductive pad 251 and the second conductive pads 260 are the same in shape, since the area R1 of one of the first conductive pads 251 located in any corner zone 240 of the chip-mounted area 220 is larger than the area R2 of one of the second conductive pads 260, compared with the gap G2 between any two adjacent ones of the second solder-ball portions 320, the gap G1 between any two adjacent ones of the first solder-ball portions 310 in this embodiment still can increase the aforementioned gap G1 so as to reduce the possibilities that solder bridging occurred between the first solder-ball portions 310 within the corner zones 240.

Figure 5:
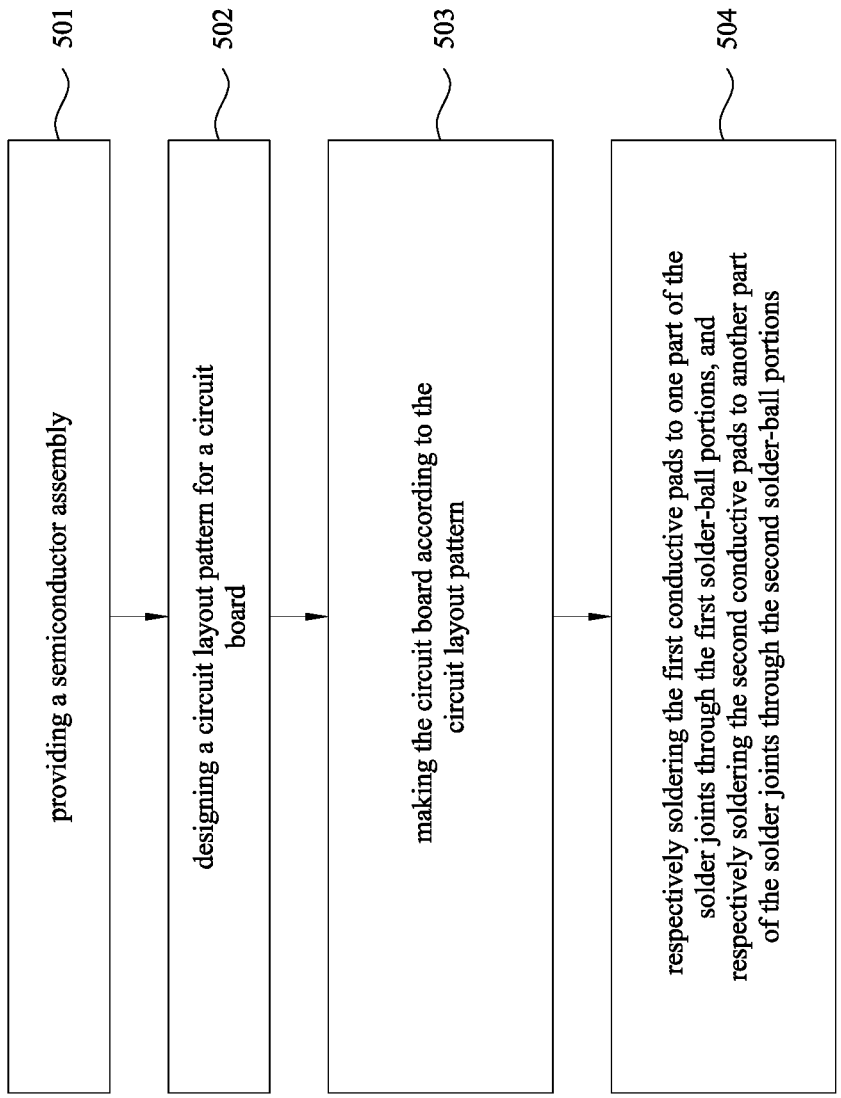
FIG. 5 is a flowchart of a method of manufacturing an electric device according to one embodiment of the present disclosure.

FIG. 5 is a flowchart of a method of manufacturing an electric device according to one embodiment of the present disclosure. As shown in FIG. 1 and FIG. 5, the method of manufacturing the electric device includes Step 501 to Step 504 mentioned as follows. In Step 501, a semiconductor assembly 100 is provided. More specifically, the semiconductor assembly 100 is provided with a substrate 110, a die 120 and a plurality of solder joints (e.g., the first solder joints 113 and second solder joints 114). The die 120 is fixedly mounted on one surface of the substrate 110, and the solder joints (e.g., the first solder joints 113 and second solder joints 114) are formed on the other surface of the substrate 110. In Step 502, a circuit layout pattern for a circuit board 200 is designed. In Step 503, the circuit board is made according to the circuit layout pattern. More specifically, the circuit layout pattern of the circuit board 200 includes a chip-mounted area 220, a plurality of first conductive pads 250 spaced to be arranged in a center zone 230 or corner zones 240 of the chip-mounted area 220, and a plurality of second conductive pads 260 spaced to be arranged within the rest area in the chip-mounted area 220 except the area that the first conductive pads 250 are arranged, and the area R2 of each of the second conductive pads 260 is smaller than the area R1 of each of the first conductive pads 250. In Step 504, the first conductive pads 250 are respectively soldered to one part of the solder joints through the first solder-ball portions 310, and the second conductive pads 260 are respectively soldered to another part of the solder joints through the second solder-ball portions 320, and the maximum width W2 of each of the second solder-ball portions 320 is greater than the maximum width W1 of each of the first solder-ball portions 310.

Figure 6:
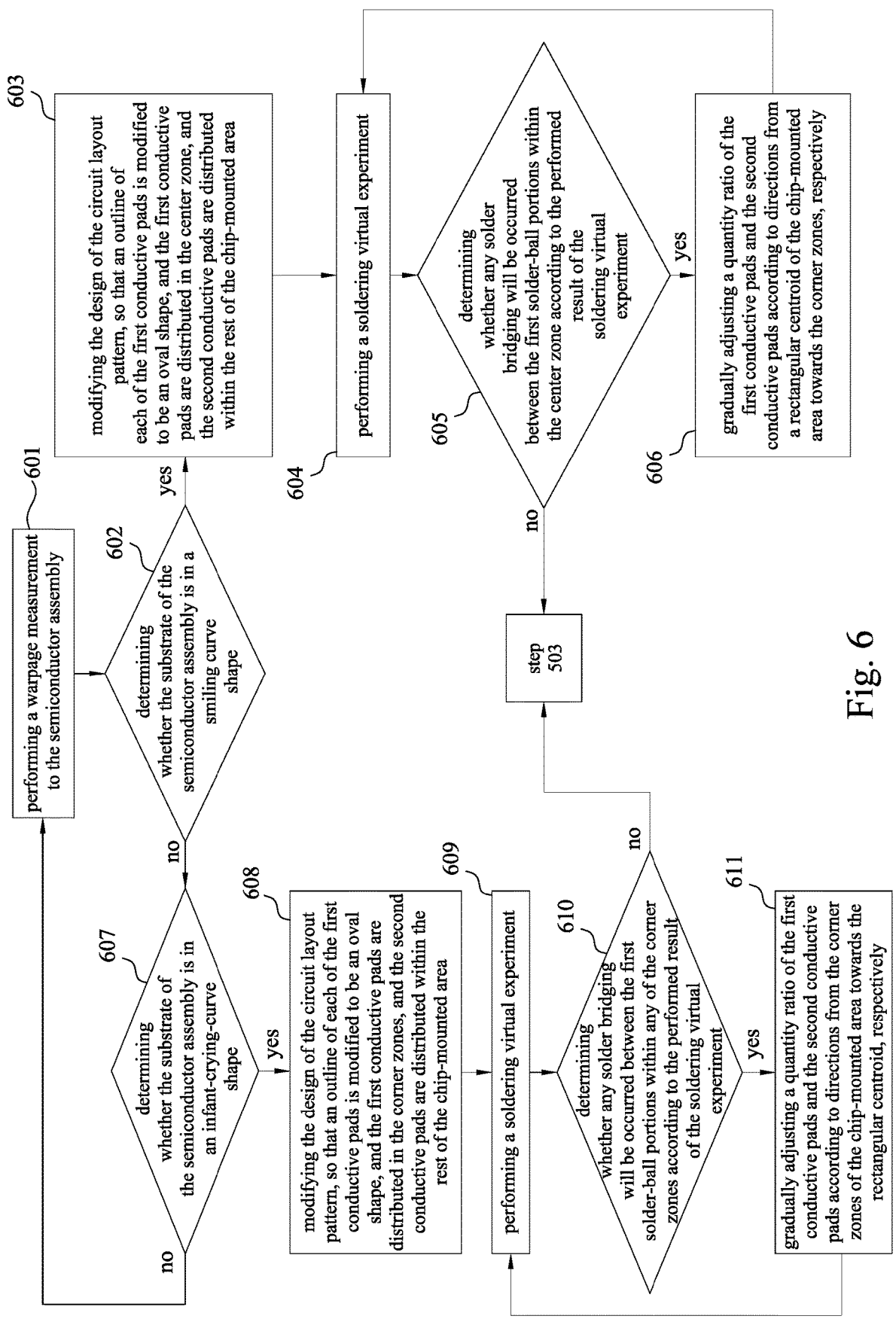
FIG. 6 is a detailed flowchart of step 502 in FIG. 5.
Figure 7A:
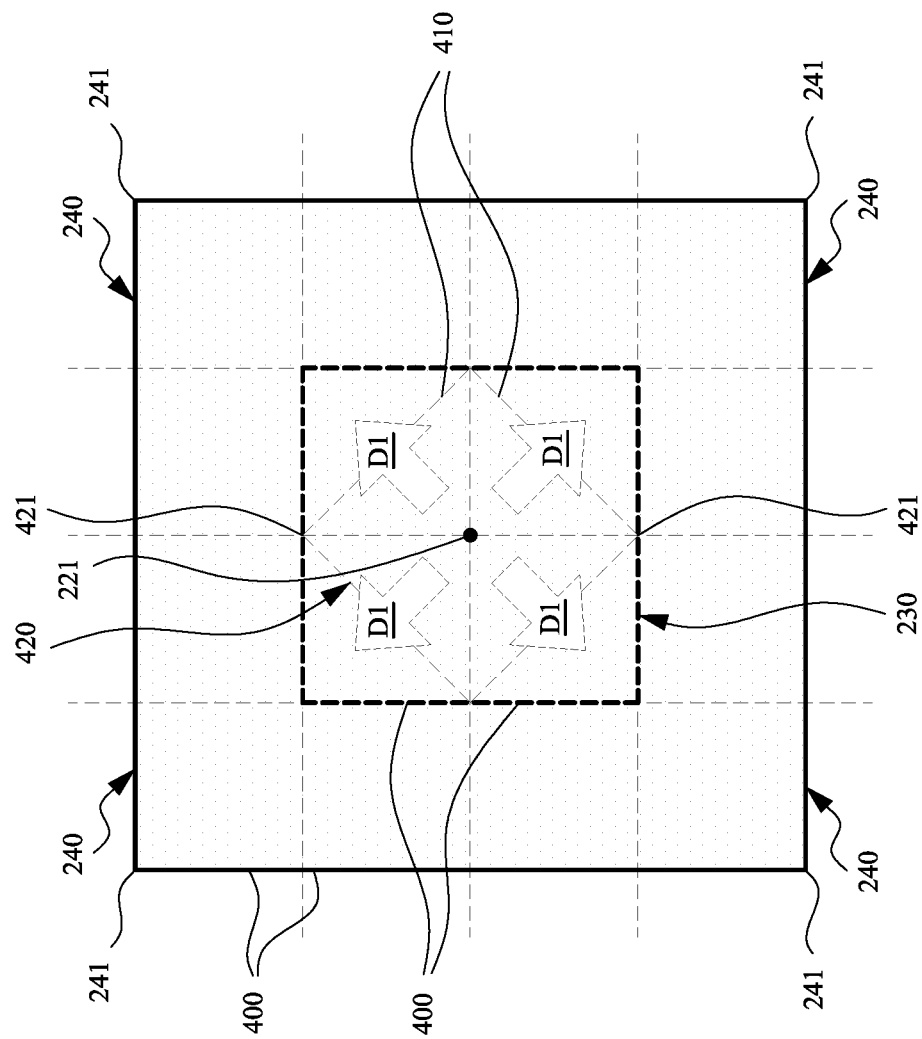
FIG. 7A is a schematic view in conjunction with step 606 of FIG. 6.
Figure 7B:
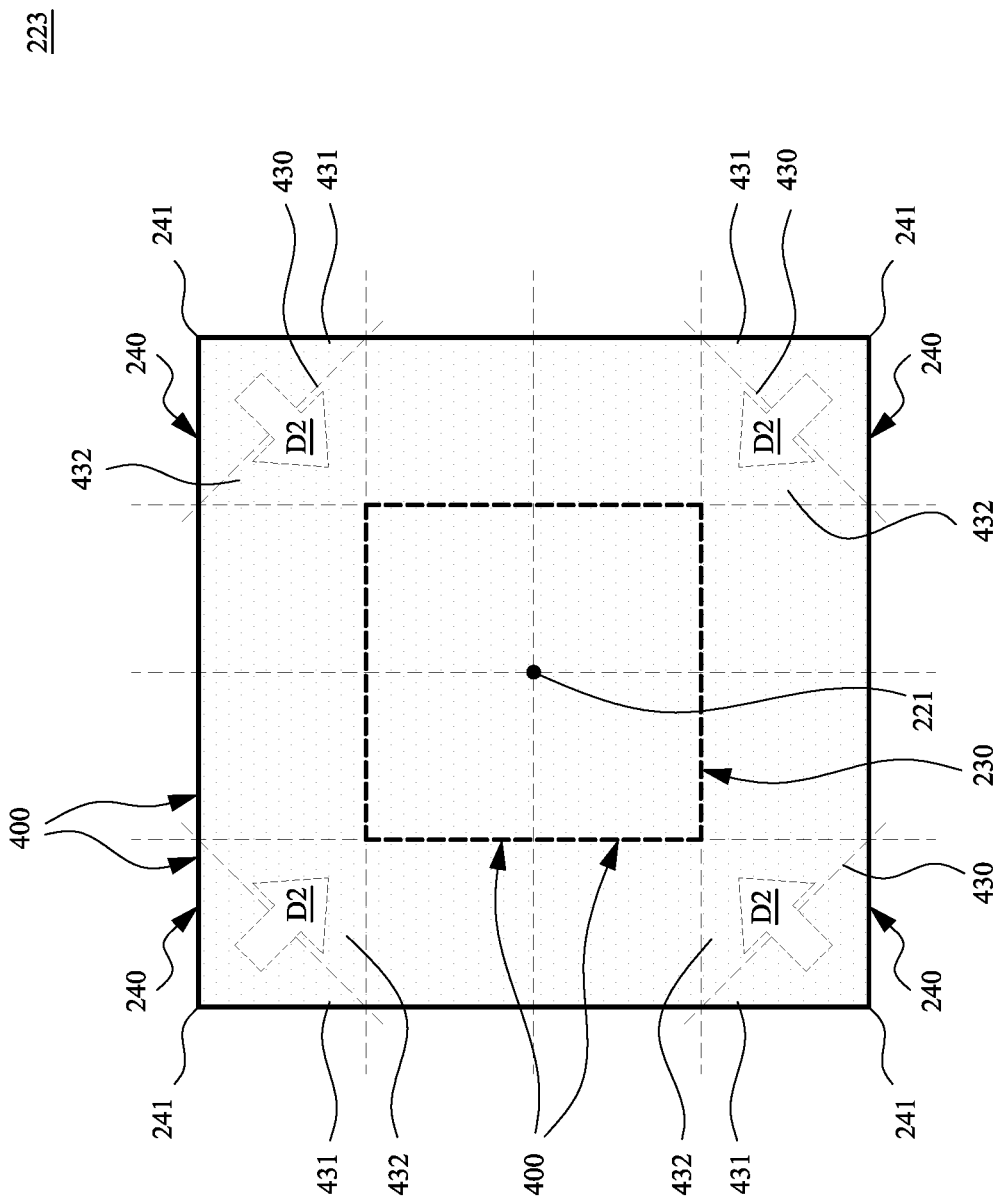
FIG. 7B is a schematic view in conjunction with step 610 of FIG. 6.

FIG. 6 is a detailed flowchart of Step 502 in FIG. 5. FIG. 7A is a schematic view in conjunction with Step 606 of FIG. 6. FIG. 7B is a schematic view in conjunction with Step 610 of FIG. 6. As shown in FIG. 6, Step 502 further includes Step 601 to Step 611 described as follows. In Step 601, a warpage measurement to the semiconductor assembly 100 is performed, and next, go to Step 602. In Step 602, a determination is made as to whether the substrate 110 of the semiconductor assembly 100 is in a smiling-curve shape, if yes, i.e., the substrate 110 is determined to be in the smiling-curve shape, then go to Step 603; otherwise, go to Step 607.

In Step 603, the design of the circuit layout pattern is modified, so that an outline of each of the first conductive pads 250 is modified to be an oval shape (FIG. 3), the first conductive pads 250 are totally positioned in the center zone 230 of the chip-mounted area 220, and the second conductive pads 260 are totally positioned within the rest area in the chip-mounted area 220 except the center zone 230, and the long axis direction 252 of each of the first conductive pads 250 passes through any two adjacent sides E of the chip-mounted area 220, then, go to Step 604. Next, in Step 604, a soldering virtual experiment is performed, then, go to Step 605. In Step 605, a determination is made as to whether any solder bridging will be formed between the first solder-ball portions 310 within the center zone 230 according to the performed result of the soldering virtual experiment, if yes, go to Step 606; otherwise, go to Step 503 mentioned above. In Step 606, a quantity ratio of the first conductive pads 250 and the second conductive pads 260 is gradually adjusted according to four directions (called first directions D1 hereinafter) from a rectangular centroid 221 of the chip-mounted area 220 towards the corner zones 240 of the chip-mounted area 220, respectively, and back to Step 604.

In Step 607, a determination is made as to whether the substrate 110 of the semiconductor assembly 100 is in an infant-crying-curve shape, if yes, i.e., the substrate 110 is determined to be in the infant-crying-curve shape, then go to Step 608, otherwise, back to Step 601. In Step 608, the design of the circuit layout pattern is modified, so that an outline of each of the first conductive pads 250 is modified to be an oval shape (FIG. 3), and the first conductive pads 250 are respectively distributed in all of the corner zones 240 of the chip-mounted area 220, and the second conductive pads 260 are distributed within the rest area (including the center zone 230) in the chip-mounted area 220 except the corner zones 240, and the long axis direction 252 of each of the first conductive pads 250 passes through any two adjacent sides E of the chip-mounted area 220, then, go to Step 609. Next, in Step 609, a soldering virtual experiment is performed, then, go to Step 610. In Step 610, a determination is made as to whether any solder bridging will be occurred between the first solder-ball portions 310 within any of the corner zone 240 according to the performed result of the soldering virtual experiment, if yes, go to Step 611, otherwise, go to Step 503 mentioned above (FIG. 5). In Step 611, a quantity ratio of the first conductive pads 250 and the second conductive pads 260 is gradually adjusted according to four directions (called second directions D2 hereinafter) from the corner zones 240 of the chip-mounted area 220 towards the rectangular centroid 221 of the chip-mounted area 220, respectively, and back to Step 609.

More specifically, Step 601 further includes a detailed step that an optical measurement for collecting shadow moiré data is performed on the semiconductor assembly 100. Therefore, from the shadow moiré data, it can be inferred that the substrate 110 of the semiconductor assembly 100 is in an infant-crying-curve shape (e.g., the substrate being convex upwards from the center portion, FIG. 1) or a smiling-curve shape (e.g., the substrate being concave downwards from the center portion, not shown in figures), however, the disclosure is not limited thereto. in Step 604 and Step 609, it further includes a detailed step that a design of experiments (DOE) of multiple (e.g., 100) surface mount technology (SMT) are performed, however, the disclosure is not limited thereto. In Step 605 and Step 610, it further includes a detailed step that a determination is made as to whether any solder bridging will be occurred between the first solder-ball portions 310 within center zone 230 or any corner zone 240 through a failure analysis (FA) tool or an X-ray (X-ray) fluoroscopic tool. However, the disclosure is not limited thereto.

As shown in FIG. 7A, the dots evenly arranged within the chip-mounted area 222 represent plural conductive pads (i.e., the first conductive pads 250 and the second conductive pads 260, refer to FIG. 2). More specifically, in the above step 502, the rectangular chip-mounted area 222 is processed by an image segmentation technique into a square array having a plurality of squares 400 (i.e., grids) with the same size, so that the squares 400 of the square array are arranged according to N*N (e.g., 4*4), and N is an integer greater than 2. The number of N above can be determined according to the number of conductive pads to be covered in each square 400. The number of N above can be adjusted according to the number of conductive pads to be covered in each of the squares 400.

Thus, when N is even, as shown in FIG. 7A, the above-mentioned center zone 230 is defined as four squares 400 adjacent to a rectangular centroid 221 of the chip-mounted area 222; or, when N is odd, the center zone is defined as a single square (not shown) covering the rectangular centroid of the chip-mounted area. In addition, all the above-mentioned corner zones 240 are four squares 400 located at the rectangular corners 241 of the chip-mounted area 222, respectively.

In Step 603, it further includes more details as follows. The first conductive pads are not evenly distributed within the center zone 230. More specifically, in this embodiment, a maximum virtual square 420 in four squares 400 of the center zone 230 is formed by one diagonal line 410 of each of the four squares 400 of the center zone 230, and the maximum virtual square 420 is inscribed within the center zone 230, and the four vertexes 421 of the maximum virtual square 420 respectively contact with four sides 231 of the center zone 230. The first conductive pads 250 are only arranged within the maximum virtual square 420 in the center zone 230, but not arranged within the rest area in the center zone 230 except the maximum virtual square 420.

In Step 606, it further includes more details as follows. The encountering some of the second conductive pads are gradually replaced by the first conductive pads according to the first directions D1 from the rectangular centroid 221 to the rectangular corners 241, respectively. For example, the configuration of the second conductive pads which is in the rest area of the center zone 230 except the maximum virtual square 420 is modified to arrange the first conductive pads instead. Next, if any solder bridging is still occurred after the soldering virtual experiment (Step 604 to Step 605), the encountering some of the second conductive pads in Step 606 can continue to be replaced by the first conductive pads according to the first directions D1 from the rectangular centroid 221 to the rectangular corners 241. Thus, Step 604 to Step 606 are repeatedly performed until the solder bridging no longer occurred in the soldering virtual experiment.

Similarly, as shown in FIG. 7B, the dots evenly arranged within the chip-mounted area 222 represent plural conductive pads (i.e., the first conductive pads 250 and the second conductive pads 260, refer to FIG. 2), and the rectangular chip-mounted area 223 is processed into a square array having a plurality of squares 400 (i.e., grids) with the same size so that the squares 400 of the square array are arranged according to N*N (e.g., 4*4), and N is an integer greater than 2. The number of N above can be determined according to the number of conductive pads to be covered in each square 400. The number of N above can be adjusted according to the number of conductive pads to be covered in each of the squares 400. In this way, the definitions of the above-mentioned center zone 230 and all of the corner zones 240 are the same as those described above.

In Step 608, it further includes more details as follows. The first conductive pads are not evenly distributed within each of the corner zones 240. More specifically, in this embodiment, each of the corner zones 240 is divided into a first virtual equilateral triangle 431 and a second virtual equilateral triangle 432 by a diagonal line 430, and the first virtual equilateral triangle 431 of each corner zone 240 is connected to the corresponding rectangular corner 241. The first conductive pads are only distributed within each first virtual equilateral triangle 431 of the corner zones, but not distributed within the rests of each corner zone 240 (i.e., the aforementioned second virtual equilateral triangle 432).

In Step 611, it further includes more details as follows. The encountering some of the second conductive pads are gradually replaced by the first conductive pads according to the second directions D2 from the rectangular corners 241 to the rectangular centroid 221. For example, the configuration of the second conductive pads which is in the second virtual equilateral triangle 432 is modified to arrange the first conductive pads instead. Next, if any solder bridging is still occurred after the soldering virtual experiment (Step 609 to Step 610), the encountering some of the second conductive pads in Step 611 can continue to be replaced by the first conductive pads according to the second directions D2 from the rectangular corners 241 to the rectangular centroid 221. Thus, Step 608 to Step 611 are repeatedly performed until the solder bridging no longer occurred in the soldering virtual experiment.

Thus, through the construction of the embodiments above, the disclosure can reduce the possibilities of solder bridging on the circuit board, improve the connection performance between the semiconductor device and the circuit board, and thus improve the reliability of the semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An electric device, comprising:
   a semiconductor assembly comprising a substrate that is in an infant-crying-curve shape, and having a first surface and a second surface which are opposite to each other, a die fixedly mounted on the second surface of the substrate, and an encapsulated portion wrapping the die on the substrate, and the first surface of the substrate is formed with a plurality of solder joints;
   a circuit board having a chip-mounted area with a rectangular shape, and the chip-mounted area comprising a center zone and a plurality of corner zones, when the chip-mounted area is processed to be a square array having a plurality of squares with the same size by an image segmentation technique, the square array is arranged according to N*N, N is an integer that is greater than 2, and the center zone is at least one of the squares of the chip-mounted area corresponding to or adjacent to a rectangular centroid of the chip-mounted area, and the corner zones respectively are four of the squares respectively located at four rectangular corners of the chip-mounted area, each of the four squares of the chip-mounted area is divided into two virtual equilateral triangles by a diagonal line;
   a plurality of first conductive pads spaced to be arranged in all of the corner zones of the chip-mounted area, and the first conductive pads respectively soldered to one part of the solder joints through a plurality of first solder-ball portions, wherein the first conductive pads are only located within one of the two virtual equilateral triangles connected to one of the four rectangular corners of the chip-mounted area; and
   a plurality of second conductive pads spaced to be arranged within a rest area in the chip-mounted area, and the second conductive pads respectively soldered to another part of the solder joints through a plurality of second solder-ball portions, wherein each of the second conductive pads is sized smaller than one of the first conductive pads, and a maximum width of each of the second solder-ball portions is greater than a maximum width of each of the first solder-ball portions.

2. The electric device of claim 1, wherein the first conductive pads are elongated, each of the first conductive pads comprises a long axis direction, the chip-mounted area has a horizontal line, wherein the long axis direction and the horizontal line form an included angle within 45°-60°.

3. The electric device of claim 1, wherein each of the first conductive pads is in an oval shape, and a long axis direction of each of the first conductive pads passes through any two adjacent sides of the chip-mounted area.

4. The electric device of claim 1, wherein the first conductive pads and the second conductive pads are in circular shapes with different areas, respectively.

5. A circuit board, comprising:
a plate body, one surface of the plate body having a chip-mounted area with a rectangular shape, and the chip-mounted area comprising a center zone and a plurality of corner zones, when the chip-mounted area is processed to be a square array having a plurality of squares with the same size by an image segmentation technique, the square array is arranged according to N*N, wherein N is an integer that is greater than 2, and the center zone is at least one of the squares of the chip-mounted area corresponding to or adjacent to a rectangular centroid of the chip-mounted area, and the corner zones respectively are four of the squares respectively located at four rectangular corners of the chip-mounted area, and each of the four squares of the chip-mounted area is divided into two virtual equilateral triangles by a diagonal line;

a plurality of first conductive pads spaced to be arranged in all of the corner zones of the chip-mounted area, wherein the first conductive pads are only located within one of the two virtual equilateral triangles connected to one of the four rectangular corners of the chip-mounted area; and a plurality of second conductive pads spaced to be arranged within a rest area in the chip-mounted area, wherein each of the second conductive pads is sized smaller than one of the first conductive pads.

6. The circuit board of claim 5, wherein the first conductive pads are elongated, each of the first conductive pads comprises a long axis direction, the chip-mounted area has a horizontal line, wherein the long axis direction and the horizontal line form an included angle within 45°-60°.

7. The circuit board of claim 5, wherein each of the first conductive pads is in an oval shape, and a long axis direction of each of the first conductive pads passes through any two adjacent sides of the chip-mounted area.

8. The circuit board of claim 5, wherein the first conductive pads and the second conductive pads are in circular shapes with different areas, respectively.

\* \* \* \* \*